(12) United States Patent
Du Plessis

(10) Patent No.: US 9,306,113 B2
(45) Date of Patent: Apr. 5, 2016

(54) SILICON LIGHT EMITTING DEVICE UTILISING REACH-THROUGH EFFECTS

(75) Inventor: Monuko Du Plessis, Pretoria (ZA)

(73) Assignee: INSIAVA (PTY) LIMITED, Pretoria (ZA)

( * ) Notice: Subject to any disclaimer, the term of this patent is extended or adjusted under 35 U.S.C. 154(b) by 0 days.

(21) Appl. No.: 13/161,113

(22) Filed: Jun. 15, 2011

(65) Prior Publication Data

US 2012/0009709 A1 Jan. 12, 2012

Related U.S. Application Data

(63) Continuation-in-part of application No. PCT/IB2009/050194, filed on Jan. 20, 2009.

(30) Foreign Application Priority Data

Dec. 15, 2008 (ZA) .................... 2008/10604

(51) Int. Cl.
| | |
|---|---|
| H01L 21/00 | (2006.01) |
| H01L 33/00 | (2010.01) |
| H01L 33/20 | (2010.01) |
| H01L 33/34 | (2010.01) |

(52) U.S. Cl.
CPC ............ *H01L 33/0016* (2013.01); *H01L 33/20* (2013.01); *H01L 33/34* (2013.01)

(58) Field of Classification Search
CPC ......... H01L 33/16; H01L 33/20; H01L 33/34; H01L 33/0016
USPC .......... 438/22, 37, 45, 91, 380; 257/186, 199, 257/438, 551, 106, E31.063, E31.116, 257/E21.355–E21.357, E33.066
See application file for complete search history.

(56) References Cited

U.S. PATENT DOCUMENTS

| | | | |
|---|---|---|---|
| 5,994,720 A | 11/1999 | Snyman et al. | |
| 6,078,090 A * | 6/2000 | Williams et al. | ............. 257/476 |
| 6,111,271 A * | 8/2000 | Snyman et al. | ................. 257/80 |
| 8,362,679 B2 | 1/2013 | Du Plessis | |
| 8,395,226 B2 | 3/2013 | Du Plessis et al. | |
| 2011/0031893 A1 | 2/2011 | Snyman et al. | |
| 2011/0042701 A1 | 2/2011 | Du Plessis et al. | |
| 2011/0068716 A1 | 3/2011 | Snyman et al. | |
| 2012/0001681 A1 | 1/2012 | Du Plessis | |
| 2013/0026534 A1 | 1/2013 | Venter | |

FOREIGN PATENT DOCUMENTS

| | | |
|---|---|---|
| EP | 0 411 612 | 2/1991 |
| JP | 2005-019840 | 1/2005 |

OTHER PUBLICATIONS

International Search Report for PCT/IB2009/050194, mailed Jun. 2, 2009.

(Continued)

*Primary Examiner* — Calvin Choi

(74) *Attorney, Agent, or Firm* — Nixon & Vanderhye, PC

(57) ABSTRACT

A light emitting device comprises a body of an indirect bandgap semiconductor material. A junction region is formed between a first region in the body of a first doping kind and a second region of the body of a second doping kind of first concentration. A third region of the second doping kind of a second concentration is spaced from the junction region by the second region. The second concentration is higher than the first concentration. A terminal arrangement is connected to the body for, in use, reverse biasing the first junction region into a breakdown mode, thereby to cause emission of light. The device is configured such that a depletion region associated with the junction region reaches through the shaped region to reach the third region, before the junction enters the breakdown mode.

7 Claims, 5 Drawing Sheets

(56) References Cited

OTHER PUBLICATIONS

Aharoni, H. et al., "A Dependency of Quantum. Efficiency of Silicon CMOS n+pp+ LEDs on Current Density", IEEE Photonics Technology Letters, vol. 17, No. 10, (Oct. 1, 2005), pp. 2041-2043.
U.S. Appl. No. 13/810,809 (Du Plessis et al.), filed Apr. 1, 2013.
U.S. Appl. No. 13/574,333 (Venter, Petrus Johannes), filed Jul. 20, 2012.
U.S. Appl. No. 13/139,653 (Du Plessis), filed Jun. 14, 2011 (now allowed).
U.S. Appl. No. 12/865,609 (Snyman et al.), filed Jul. 30, 2010.
U.S. Appl. No. 12/863,743 (Snyman et al.), filed Jul. 20, 2010.
U.S. Appl. No. 12/740,597 (Du Plessis et al.), filed Oct. 20, 2010.

* cited by examiner

SILICON LIGHT EMITTING DEVICE UTILISING REACH-THROUGH EFFECTS This application a continuation-in-part of International Application No. PCT/IB2009/050194, filed 20 Jan. 2009, and claims priority to South African Application Nos. 2008/10604, filed 15 Dec. 2008, the entire contents of each of which are hereby incorporated herein by reference.

INTRODUCTION AND BACKGROUND

This invention relates to optoelectronic devices and more particularly to a light emitting device fabricated from an indirect bandgap semiconductor material, to a method of operating a light emitting device and to a method of fabricating a light emitting device in an indirect bandgap semiconductor material.

Avalanche electroluminescent light emission in single crystal indirect bandgap semiconductors (e.g. silicon) is generated by the interaction between mobile hot carriers (e.g. recombination of electrons and holes) and lattice phonons in reverse biased pn junctions.

Figure 1:
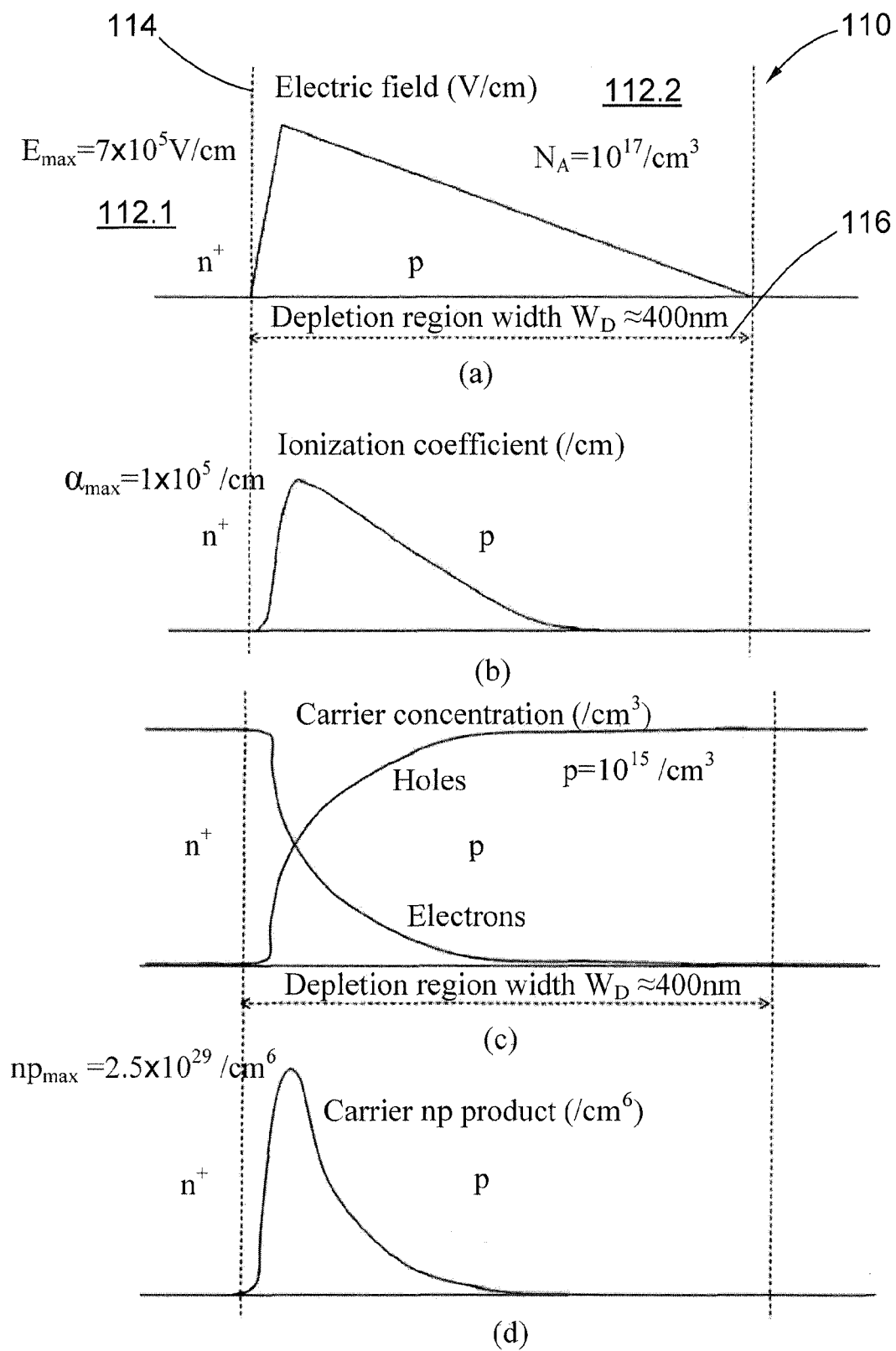

As will be illustrated hereinafter with reference to FIG. 1 of the accompanying diagrams, in conventional reversed biased $n^+p$ junctions in silicon devices, carriers experience impact ionization over a short distance only in the depletion region. A low electric field at the end of the p side remote from the junction means that hot or energetic carriers are only present at the $n^+$ side of the depletion region and that holes leaving the depletion region at the opposite side thereof will be low energy carriers. If the carrier recombination rate is proportional to the product $p^*n$ of the hole p and the electron n concentrations, carrier recombination will occur in a short region of the depletion region only. These features and parameters contribute to an internal quantum efficiency, which is not satisfactory.

OBJECT OF THE INVENTION

Accordingly, it is an object of the present invention to provide an alternative light emitting device, a method of operating a light emitting device and a method of fabricating a light emitting device with which the applicant believes the aforementioned disadvantages may at least be alleviated.

SUMMARY OF THE INVENTION

According to the invention there is provided a light emitting device comprising:
  a body of an indirect bandgap semiconductor material;
  a junction region formed between a first region in the body of a first doping kind and a second region of the body of a second doping kind of a first concentration;
  the body comprising a third region of the second doping kind of a second concentration spaced from the junction region by the second region;
  wherein the second concentration is higher than the first concentration; and
  a terminal arrangement connected to the body for, in use, reverse biasing the first junction region into a breakdown mode, thereby to cause emission of light.

The breakdown mode may be field emission breakdown, alternatively avalanche breakdown, further alternatively a combination of field emission breakdown and avalanche breakdown.

The third region may be located on another side of the second region as the first region. In one form of the invention, the second region may be sandwiched between the first region and the second region.

The device may be configured such that a depletion region associated with the junction region reaches the third region of the body, before the junction region enters breakdown.

The terminal arrangement may comprise a first contact connected to the first region of the body and a second contact connected to the third region of the body. In one embodiment of the invention, no contact is provided on the second region, so that the device is essentially a two terminal device.

Also included within the scope of the present invention is a method of operating a light emitting device, the method comprising the steps of:
  utilizing a body of an indirect bandgap semiconductor material with a junction region formed between a first region in the body of a first doping kind and a second region of the body of a second doping kind of a first concentration, the body comprising a third region of the second doping kind of a second concentration spaced from the junction region by the second region and wherein the second concentration is higher than the first concentration; and
  reverse biasing the first junction region into a breakdown mode; and
  causing a depletion region associated with the junction region to reach the third region of the body, before the junction region enters the breakdown mode.

Yet further included within the scope of the present invention is a method of fabricating a light emitting device, the method comprising the steps of:
  utilizing a body of an indirect bandgap semiconductor material;
  forming a junction region between a first region in the body of a first doping kind and a second region of the body of a second doping kind of a first concentration,
  forming a third region of the body of the second doping kind of a second concentration spaced from the junction region by the second region; and
  causing the second concentration to be higher than the first concentration.

The method may comprise the further step of shaping at least part of the second region to conform with a required light emitting shape.

BRIEF DESCRIPTION OF THE ACCOMPANYING DIAGRAMS

Figure 2:
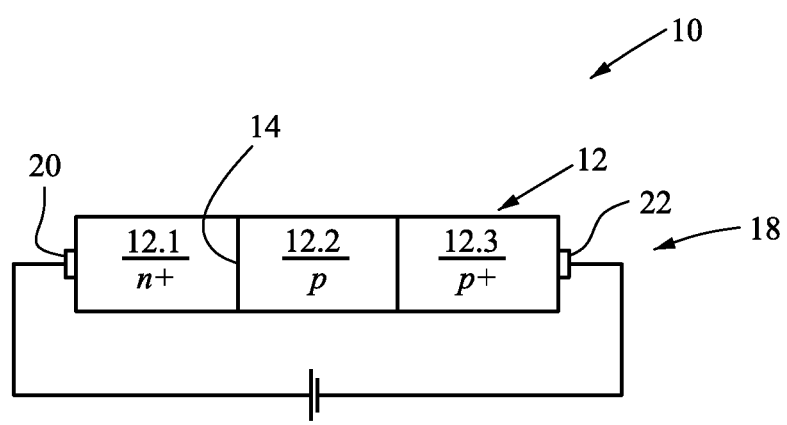
Figure 4:
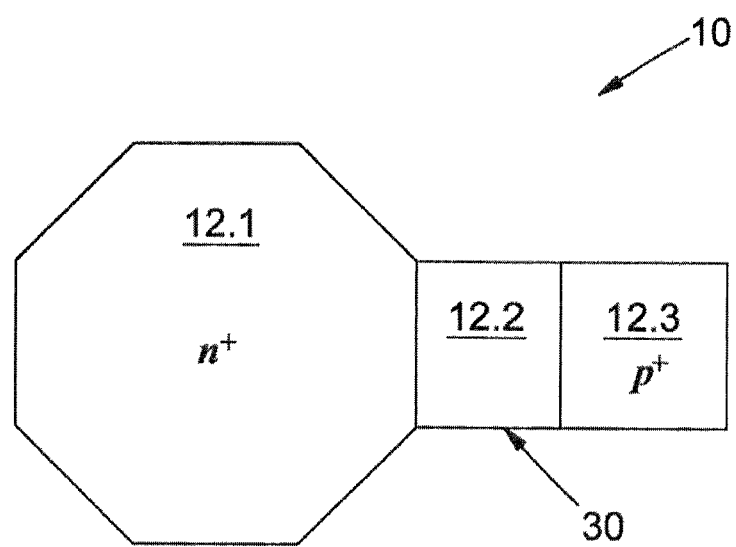
Figure 5:
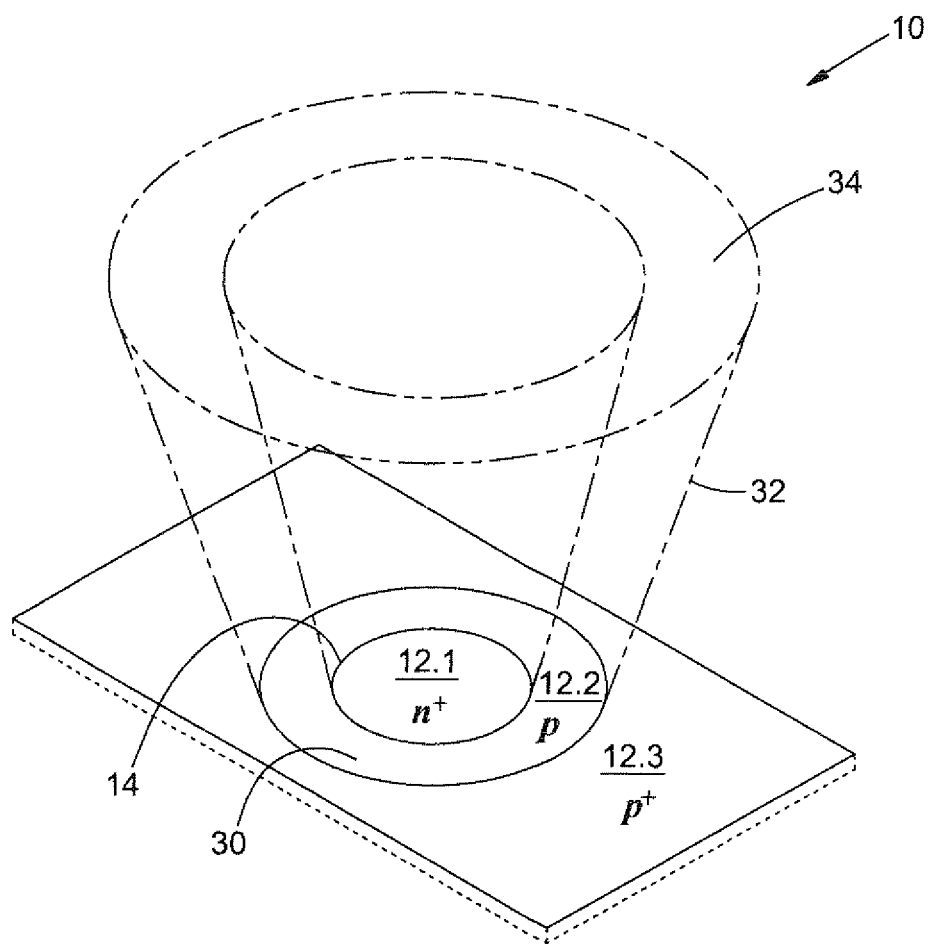

The invention will now further be described, by way of example only, with reference to the accompanying diagrams wherein:

FIGS. 1(a) to 1(d) are diagrams illustrating various features and parameters of a conventional $n^+p$ silicon junction in avalanche;

FIG. 2 is a diagrammatic representation of a light emitting device according to the invention;

FIGS. 3(a) to (d) are diagrams corresponding to that in FIGS. 1(a) to 1(d) for the device according to the invention;

FIG. 4 is a diagrammatic representation of another example embodiment of the light emitting device; and FIG. 5 is a diagrammatic representation of still another example embodiment of the light emitting device.

DESCRIPTION OF A PREFERRED EMBODIMENT OF THE INVENTION

A multi-terminal light emitting device fabricated from an indirect bandgap semiconductor material, such as Si, Ge and Si—Ge, is generally designated by the reference numeral 10 in FIG. 2.

The device 10 comprises a body 12 of the indirect bandgap semiconductor material, in this case Si. The body comprises a first junction region 14 between a first region 12.1 of the body of a first doping kind and a second is region 12.2 of the body of a second doping kind of a first doping concentration. A third region 12.3 of the body of the second doping kind, but of a second doping concentration is provided on another or opposite side of the second region 12.2 as the first region 12.1, to be spaced from the junction region 14 by the second region 12.2. The second doping concentration is higher than the first doping concentration. The first doping kind may be n and the second doping kind may be p. In other embodiments opposite doping kinds may be used. A terminal arrangement 18 is connected to the body for, in use, reverse biasing the junction region 14 into a breakdown mode, either avalanche or field emission or a combination thereof, thereby to emit light. The terminal arrangement 18 may comprise a first contact 20 connected to the first region 12.1 of the body 12 and a second contact 22 connected to the third region 12.3 of the body 12.

Referring now to a conventional or prior art $n^+p$ junction silicon device 110 shown in FIGS. 1(a) to 1(d) where there are respectively shown the conventional electric field, electron avalanche ionization coefficient, carrier concentrations and carrier pn product profiles at the avalanching operating point. Typical values are also shown in the figures. The dimensions given are for a typical $n^+p$ junction silicon device 110 with a low doped p region 112.2 with doping concentration or density of $10^{16}$ acceptor atoms/cm$^3$, and a high doped $n^+$ region 112.1 with doping density $10^{20}$ donor atoms/cm$^3$. The width of a depletion region 116 is about 400 nm at breakdown. The carrier concentrations are the values needed for an approximate $10^3$ A/cm$^2$ current density. The breakdown voltage of this device is in the order of 12V.

FIG. 1(a) depicts the electric field profile in the junction depletion region 116 at breakdown. FIG. 1(b) shows the ionization coefficient of the electrons in the depletion region 116. From these two figures it is evident that carriers will only experience impact ionization over a short distance within the depletion region 116. The low electric field remote from the junction 114 also means that hot energetic carriers are only present near the $n^+$ side of the depletion region, and that holes leaving the depletion region 116 near the p side will be low energy carriers.

FIG. 1(c) shows the carrier concentration profiles in the depletion region 116, and FIG. 1(d) exhibits the p*n carrier product. If the carrier recombination rate is proportional to the product pn of the hole p and the electron n concentrations in the depletion region 116, then carrier recombination will occur in a short region of the depletion region only.

It is believed that with the device 10 according to the invention shown in FIG. 2, the internal quantum efficiency of photon generation may be improved, more particularly by using the reach through effect. The internal quantum efficiency (number of photons generated per electron) is enhanced if more carrier-to-carrier or carrier-photon interactions can take place in the same volume. Improved power efficiency (optical power out vs. electrical power in) can also be achieved if the devices can be operated at lower operating voltages.

Figure 3:
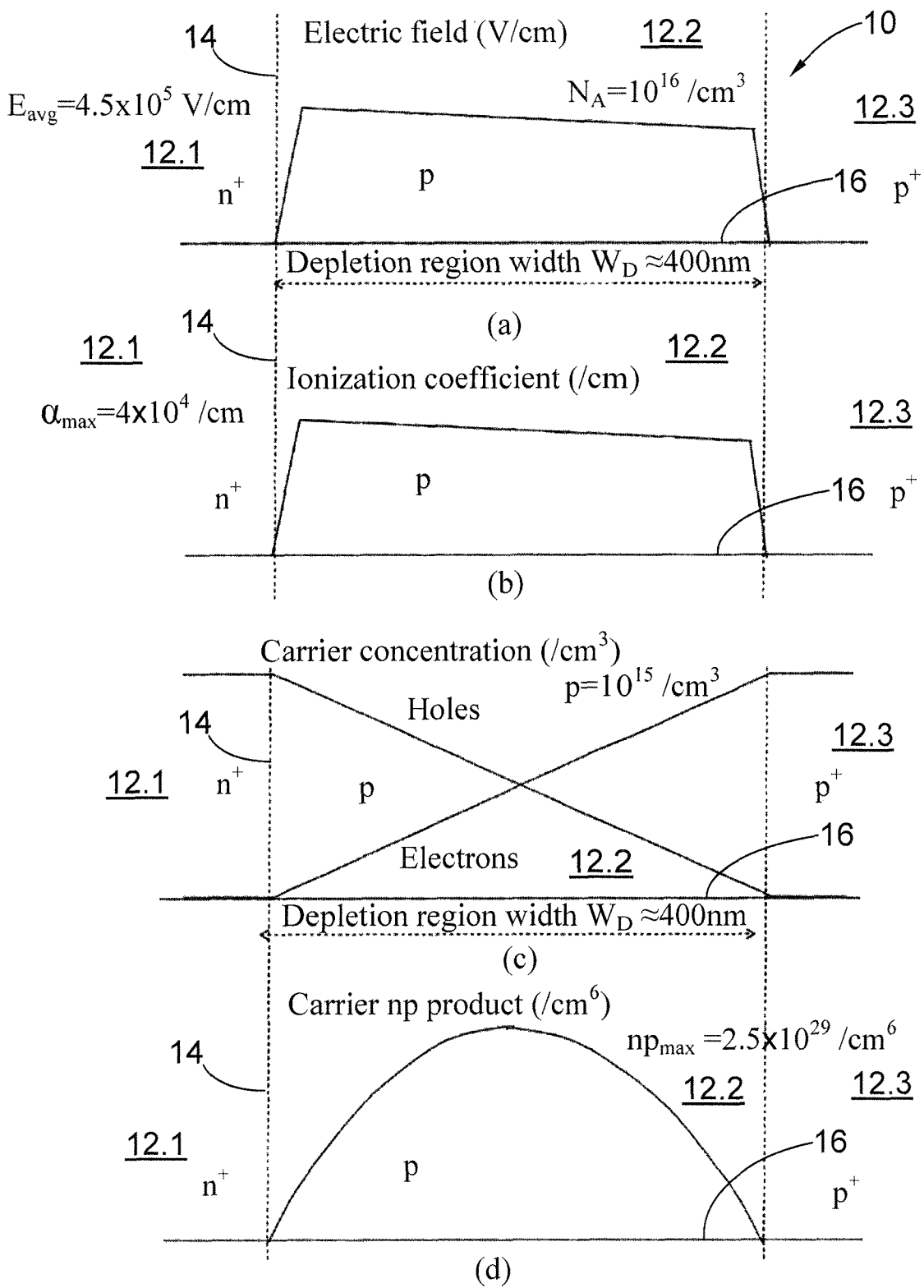

Referring now again to the device 10 according to the invention, and as shown in 3(a) to 3(d), a region 12.3 of high doping with the same polarity as the lightly doped region 12.2, is placed in close proximity to the reverse biased n+p junction 14. There is hence formed a n+pp+ doping profile junction. When the junction 14 is reverse biased, the depletion region 16 spreads mainly into the lightly doped p region 12.2. If the depletion region reaches the p+ region 12.3 before breakdown has taken place, the junction will be in the reach through region of operation. A further increase in reverse voltage will cause the depletion region to spread into the p+ region 12.3, causing breakdown without too much further increase in the reverse voltage. FIG. 3(a) shows the reach through $n^+pp^+$ device with the acceptor doping $N_A=10^{16}$/cm$^3$ in the p region 12.2, and the spacing between the $n^+$ region 12.1 and the $p^+$ region 12.3 equal to 400 nm. This was done to compare the reach through device 10 with a 400 nm depletion region to a conventional $n^+p$ device 110 with the same depletion region width and referred to hereinbefore.

In the reach through condition, the electric field 20 (see FIG. 3(a)) is relatively high and almost constant throughout the entire depletion region 16. This means that the ionization coefficient is also relatively constant across the whole depletion region 16, as indicated in FIG. 3(b). The breakdown voltage can be determined from the electric field profile and is also approximately 12V.

This reach through device 10 ensures that the carriers traversing the depletion region 16 remain "hot" (high energy carriers) throughout the entire depletion region, up to the point where they leave the depletion region. Furthermore, avalanche impact ionization events are expected to take place throughout substantially the entire depletion region 16.

Another advantage of this type of reach through device 10 is that the carriers move at the carrier saturation velocity through the entire depletion region 16, due to the high electric field 20 throughout the depletion region 16. This is expected to make the reach through device carrier transit time less than that of the conventional diode, and thus increase the switching speed of the light generation process.

In FIG. 3(c) there is shown the carrier concentration profiles for the $n^+pp^+$ reach through device 10. The electron concentration in the depletion region 16 is higher than in the conventional device, and with the higher ionization coefficient of electrons compared to holes, more impact ionization events may occur.

FIG. 3(d) depicts the carrier concentration product n*p. It is evident that the carrier concentration product p*n is significantly higher for most regions in the depletion region 16 when compared to the conventional device 110. If an integral of the p*n product is taken over the whole length of the depletion region, a significant higher integrated p*n product is achieved compared to the conventional $n^+p$ device. Hence, one may expect a higher radiative carrier recombination rate in the reach through device 10 at the same current density and breakdown voltage compared to the conventional device.

The reach through device 10 may have a faster switching speed and may provide the ability to adjust the breakdown voltage to lower or higher values by varying the distance between the $n^+$ and $p^+$ regions. Decreasing the $n^+$ to $p^+$ distance reduces the breakdown voltage.

As shown in FIGS. 4 and 5, the shape of a light generation region 30 may be designed to a desired geometry by providing a suitable geometry for at least part of the second region 12.2 and hence depletion region 16. More particularly, at least one two dimensional region 30 or face of the second region 12.2 extending from the junction 14 to the third region 12.3 is shaped to have any suitable shape, including but not limited to rounded, including but not limited to circular and elliptical, polygonal, including but not limited to triangular, square, rectangular etc and annular, so that when the device is reverse biased into a breakdown mode, the depletion region associated with the junction region 14 reaches through the shaped region 30 to reach the third region before the junction region enters the breakdown mode and so that light is emitted from the entire shaped region 30 as shown in FIG. 5, the light may be emitted in a radiation pattern 32 having a cross-sectional shape 34 corresponding to the shape of the shaped region 30.

In the case of the conventional device, the breakdown is a perimeter dominated process, and will occur where the electric field is the highest, for example wherever sharp corners are present on the perimeter. Shaping of the light generation region geometry is not possible with the conventional diode.

While the invention has been described in connection with what is presently considered to be the most practical and preferred embodiment(s), it is to be understood that the invention is not to be limited to the disclosed embodiment(s), but on the contrary, is intended to cover various modifications and equivalent arrangements included within the to spirit and scope of the appended claims.

The invention claimed is:

1. A method of fabricating a light emitting device, the method comprising:
    providing a body of an indirect bandgap semiconductor material having a surface;
    forming a first region in the body of a first doping kind and a second region in the body of a second doping kind of a first doping concentration so as to form a junction between the first region and the second region;
    forming a third region in the body of the second doping kind of a second doping concentration, which is spaced from the junction by the second region;
    the second doping concentration being higher than the first doping concentration;
    providing a terminal arrangement connected to the body for reverse biasing the junction into a breakdown mode, to thereby cause an emission of light from the light emitting device;
    the first doping concentration of the second doping kind of the second region and a dimension of the second region, which is measured across the second region from the first region to the third region, being such that, when, in use, a reverse bias voltage which is applied to the light emitting device reaches a first and reach through level, a depletion region associated with the junction reaches through the second region to reach the third region before the junction enters the breakdown mode, and upon the reverse bias voltage reaching a second and higher breakdown level, the junction enters the breakdown mode, and the light is emitted through the surface.

2. The method as claimed in claim 1 wherein the terminal arrangement comprises a first contact connected to the first region of the body and a second contact connected to the third region of the body.

3. The method as claimed in claim 2 wherein neither the first contact nor the second contact is provided directly on the second region.

4. The method as claimed in claim 1 wherein the first doping kind is n and the second doping kind is p.

5. The method as claimed in claim 1 wherein the first doping kind is p and the second doping kind is n.

6. A light emitting device comprising:
    a body of an indirect bandgap semiconductor material having a surface;
    the body comprising a first region of a first doping kind, a second region of a second doping kind of a first doping concentration so as to form a junction between the first region and the second region and a third region of the second doping kind of a second doping concentration spaced from the junction by the second region;
    the second concentration being higher than the first concentration;
    a terminal arrangement connected to the body for reverse biasing the junction into a breakdown mode, to thereby cause an emission of light from the light emitting device;
    the doping concentration of the second region and a dimension of the second region measured across the second region from the first region to the third region being such that, when, in use, a reverse bias voltage which is applied to the light emitting device reaches a first and reach through level, a depletion region associated with the junction reaches through the second region to reach the third region before the junction enters the breakdown mode, and upon the reverse bias voltage reaching a second and higher breakdown voltage, the junction enters the breakdown mode, and the light is emitted through the surface.

7. A method of operating a light emitting device comprising a body of an indirect bandgap semiconductor material having a surface; the body comprising a first region of a first doping kind, a second region of a second doping kind of a first doping concentration so as to form a junction between the first region and the second region and a third region of the second doping kind of a second doping concentration spaced from the junction by the second region; the second concentration being higher than the first concentration; a terminal arrangement connected to the body for reverse biasing the junction into a breakdown mode, to thereby cause an emission of light from the light emitting device; the method comprising:
    applying a reverse bias voltage to the light emitting device;
    allowing the reverse bias voltage to reach a first and reach through level, to cause a depletion region associated with the junction to reach through the second region to reach the third region before the junction enters the breakdown mode, and
    allowing the reverse bias voltage to reach a second and higher breakdown level, so that the junction enters a breakdown mode, and the light is emitted through the surface.

* * * * *